(12) United States Patent
Lebby et al.

(10) Patent No.: US 8,455,756 B2
(45) Date of Patent: Jun. 4, 2013

(54) HIGH EFFICIENCY SOLAR CELL USING IIIB MATERIAL TRANSITION LAYERS

(75) Inventors: Michael Lebby, Apache Junction, AZ (US); Andrew Clark, Palo Alto, CA (US)

(73) Assignee: Translucent, Inc., Palo Alto, CA (US)

( * ) Notice: Subject to any disclaimer, the term of this patent is extended or adjusted under 35 U.S.C. 154(b) by 359 days.

(21) Appl. No.: 12/708,969

(22) Filed: Feb. 19, 2010

(65) Prior Publication Data
US 2011/0203666 A1    Aug. 25, 2011

(51) Int. Cl.
*H01L 31/00*    (2006.01)
(52) U.S. Cl.
USPC ............................ 136/261; 136/262; 136/264
(58) Field of Classification Search
USPC .................. 136/252, 261, 262, 264, 260
See application file for complete search history.

(56) References Cited

U.S. PATENT DOCUMENTS

| | | | | |
|---|---|---|---|---|
| 6,045,626 | A * | 4/2000 | Yano et al. | 148/33.4 |
| 6,069,021 | A * | 5/2000 | Terashima et al. | 438/46 |
| 2006/0276003 | A1* | 12/2006 | Celler | 438/455 |
| 2007/0178668 | A1* | 8/2007 | Nakai et al. | 438/471 |
| 2010/0116315 | A1* | 5/2010 | Clark et al. | 136/244 |
| 2010/0122720 | A1* | 5/2010 | Clark et al. | 136/244 |

OTHER PUBLICATIONS

Crystalline Silicon Photovoltaic Cells obtained online from: http://www.eere.energy.gov/basics/renewable_energy/crystalline_silicon.html?print ,date Aug. 12, 2011.*
Hassaun A. Jones-Bey "Indium nitride bandgap energy is revealed", Laser Focus World, vol. 39 Issue 1, published Jan. 1, 2003, obtained online from http://www.laserfocusworld.com/articles/print/volume-39/issue-1/world-news/indium-nitride-bandgap-energy-is-revealed.html.*
Irvine et al, Substrate/layer relationships in II-VIs, Journal of Crystal Growth, vol. 197, Issue 3, pp. 616-625, Feb. 16, 1999.*
Zhao et al "Band gap enhancement and electrical properties of La2O3 films doped with Y2O3 as high-k gate insulators", Applied Physcis Letters vol. 94, Issue 4, pp. 042901-1-042901-3.*

* cited by examiner

*Primary Examiner* — Alexander Kollias
(74) *Attorney, Agent, or Firm* — Parsons & Goltry; Robert A. Parsons; Michael W. Goltry

(57) ABSTRACT

A solar cell including a base of single crystal silicon with a cubic crystal structure and a single crystal layer of a second material with a higher bandgap than the bandgap of silicon. First and second single crystal transition layers are positioned in overlying relationship with the layers graduated from a cubic crystal structure at one surface to a hexagonal crystal structure at an opposed surface. The first and second transition layers are positioned between the base and the layer of second material with the one surface lattice matched to the base and the opposed surface lattice matched to the layer of second material.

5 Claims, 6 Drawing Sheets

HIGH EFFICIENCY SOLAR CELL USING IIIB MATERIAL TRANSITION LAYERS

FIELD OF THE INVENTION

This invention relates to solar cells.

More particularly, the present invention relates to solar cells including transition layers of rare earth and the like (IIIB materials), scandium and yttrium are considered rare earths, between collection layers.

BACKGROUND OF THE INVENTION

It is well known in the solar cell art that most solar cells are able to convert only a small portion of solar energy into electricity. Also, because of the extensive background information (due at least in part to the semiconductor industry) and the small expense and availability, the most prominent material utilized in the industry is silicon. Further, silicon based solar cells can be easily and inexpensively integrated into silicon circuits for collection and other functions.

One of the major causes of the inefficiency of silicon is energy lost due to thermal processes in silicon. Thermal losses are directly related to the energy of incoming photons and how much greater that incoming energy is than the bandgap of the cell material. Silicon material has a relatively low bandgap and, therefore, much of the solar energy is lost. Use of higher bandgap materials to absorb and convert higher energy photons would result in lower overall thermalization losses. Also, it is very inefficient to provide solar cells using only higher bandgap materials, since most of the lower energy is lost. However, it is generally difficult to integrate higher bandgap materials with or into silicon devices.

It would be highly advantageous, therefore, to remedy the foregoing and other deficiencies inherent in the prior art.

An object of the present invention is to provide a new and improved high efficiency solar cell.

Another object of the present invention is to provide a high efficiency rare earth solar cell including transition layers of IIIB material between collection layers.

SUMMARY OF THE INVENTION

Briefly, to achieve the desired objects and aspects of the instant invention in accordance with a preferred embodiment thereof, provided is a solar cell including a base of single crystal silicon with a cubic crystal structure and a single crystal layer of a second material with a higher bandgap than the bandgap of silicon. First and second single crystal transition layers are positioned in overlying relationship with the layers graduated from a cubic crystal structure at one surface to a hexagonal crystal structure at an opposed surface. The first and second transition layers are positioned between the base and the layer of second material with the one surface lattice matched to the base and the opposed surface lattice matched to the layer of second material.

The desired objects and aspects of the instant invention are further achieved in accordance with a preferred method of fabricating a solar cell including the step of providing a single crystal base of single crystal silicon with a cubic crystal structure and a bandgap. The method further includes the steps of depositing a first single crystal transition layer and a second single crystal transition layer in overlying relationship on the base with the first and second transition layers, respectively, graduated from a cubic crystal structure at a surface lattice matched to the base to a hexagonal crystal structure at an opposed surface and depositing a single crystal layer of a second material with a higher bandgap than the bandgap of silicon on the opposed surface of the first and second transition layers, the single crystal layer of the second material being lattice matched to the opposed surface.

BRIEF DESCRIPTION OF THE DRAWINGS

Specific objects and advantages of the instant invention will become readily apparent to those skilled in the art from the following detailed description of a preferred embodiment thereof taken in conjunction with the drawings, in which.

DETAILED DESCRIPTION OF THE PREFERRED EMBODIMENT

Figure 1:
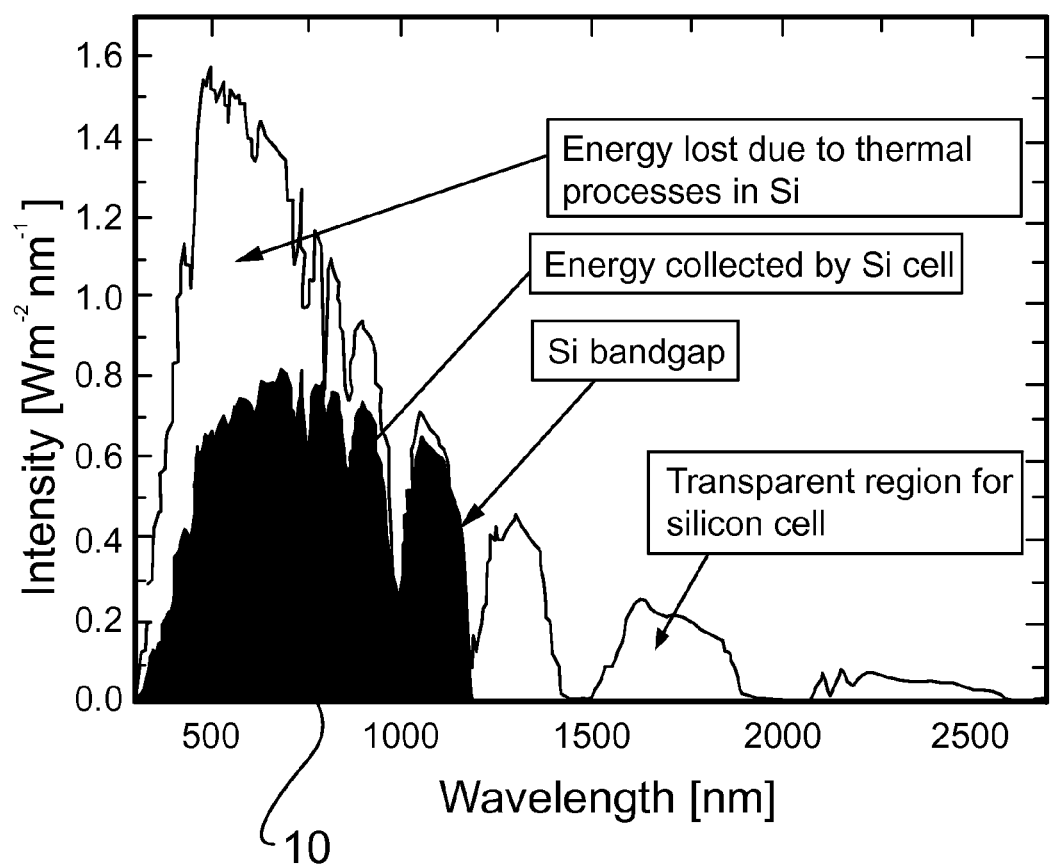
FIG. 1 is a graphical representation of the solar emission spectrum and the portion of that spectrum collected by a silicon solar cell.

Turning now to the drawings, attention is first directed to FIG. 1 which illustrates the approximate wavelength and energy spectrum of sunlight (solar emission). In this graph the wavelength in nanometers (nm) of solar emissions is shown along the X-axis and the intensity of solar emissions is shown along the Y-axis. The portion of this energy collected by a silicon solar cell is shown as a darkened area, designated 10, beneath or within the solar spectrum. As is understood in the art, silicon solar cells are transparent to light above approximately 1100 nm so that collection stops at approximately that wavelength. Also, substantial amounts of solar energy are lost due to thermal processes in the silicon. These thermal losses are represented by the difference between the peak solar intensity at the various wavelengths and the peak absorbed amount in darkened area 10.

Incorporating higher bandgap materials, such as InGaN, into a silicon solar cell to absorb and convert higher energy photons would result in lower overall thermalization losses and, therefore, higher efficiency solar cells. InGaN is used as an example of a higher bandgap material in this disclosure because of its common use in the semiconductor industry. However, it should be understood that other materials with a higher bandgap than silicon can be used and are intended to be incorporated into the generic term "higher bandgap materials".

Figure 2:
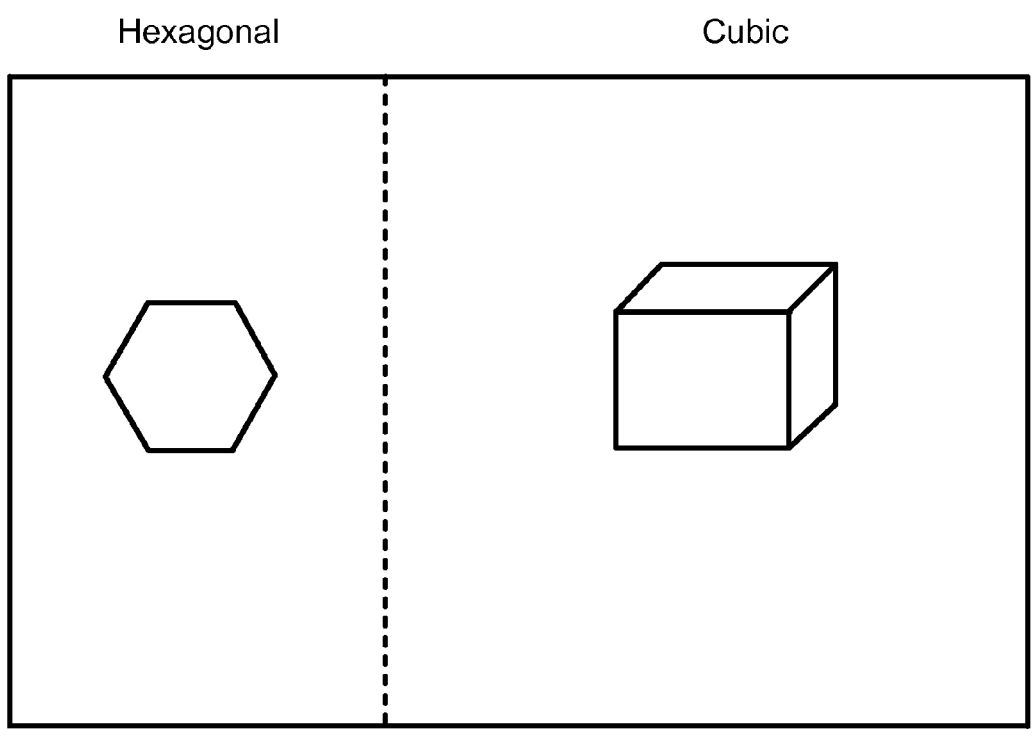
FIG. 2 illustrates the different crystal orientations for the rare earth oxides.

The major problem with any attempts to incorporate higher bandgap materials with silicon is the particular crystal orientation of the material. Silicon has a cubic crystal orientation and many other higher bandgap materials, such as InGaN, have a hexagonal crystal orientation. Expitaxially growing hexagonal crystals onto cubic crystals will generate huge lattice mismatch and crystal defects which will limit the usefulness of the material for device design. Thus, it is difficult to incorporate single crystal InGaN into a single crystal silicon solar cell since the different crystals of the two materials are difficult or impossible to lattice match. Typical hexagonal and cubic crystal orientations of rare earth materials are illustrated in FIG. 2. FIG. 2 shows that rare earth materials can be engineered to align on either cubic or hexagonal lattice structures.

Figure 3:
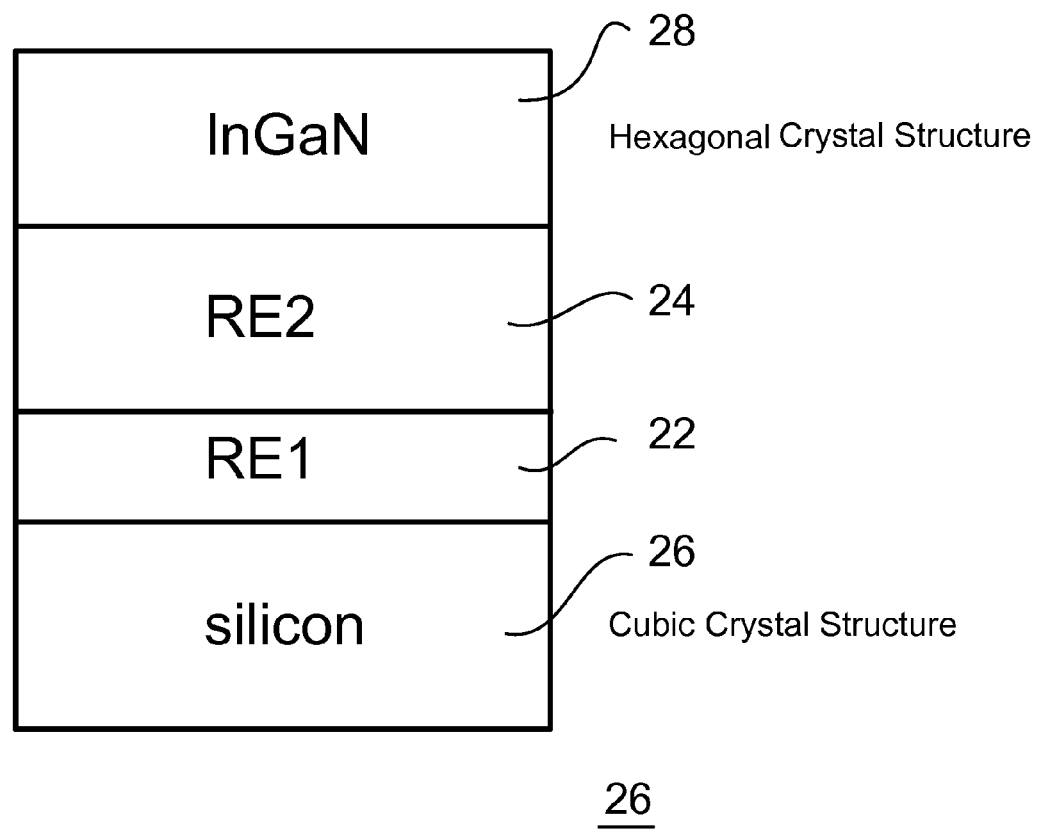
FIG. 3 is a simplified sectional view of a solar cell with rare earth transition layers in accordance with the present invention.

Turning to FIG. 3, a simplified sectional view of a solar cell, designated 20, is illustrated. Basically, single crystal oxides of rare earth and the like are deposited as transition layers 22 and 24 between a single crystal silicon base 26 and a single crystal layer 28 of higher bandgap material, such as InGaN. Silicon base 26 is any single crystal structure, such as a silicon substrate, a silicon wafer, or chip, etc. Here it should be understood that the term "single crystal" is used to denote crystalline silicon grown or formed as a single continuous crystal well known in the art.

As explained above, silicon has a cubic crystal structure and InGaN has a hexagonal cubic structure. To allow the continuous single crystal growth of solar cell 20 (i.e. integration), first transition layer 22 of an oxide of rare earth or the like is chosen from a material having a cubic crystal structure. Illustrated in FIG. 2 are the different crystal orientations for rare earth oxides (lanthanides). Also, some other materials classified in the IIIB group of the periodic table such as scandium (Sc), have a hexagonal crystal structure. Scandium and yttrium are considered rare earths. As an example, $Eu_2O_3$ has a cubic crystal structure and a lattice spacing of 10.9 Å so that it is lattice matched to silicon and single crystal layer 22 can be grown on single crystal silicon layer 26 with no stress or strain in or between layers 26 and 22.

Second layer 24 of an oxide of rare earth or the like is chosen from a material having a hexagonal crystal structure. As an example, $Sc_2O_3$ has a hexagonal crystal structure and a lattice spacing of 3.2 Å so that it is lattice matched to GaN. Thus, single crystal layer 28 of InGaN can be grown on second single crystal layer 24 with no stress or strain in or between layers 26 and 22. Here it should be understood that stress or strain in the collecting layer can result in defects in the crystal structure and a loss of efficiency. Thus, in many situations it is desirable to reduce or eliminate any substantial stress or strain in the crystal structure of the collecting layers (i.e. layers 26 and 28 in this embodiment). Note that small lattice mismatching, e.g. 1% or less, will generally produce small enough stress or strain that will not cause defects in the lattice match.

Figure 4:
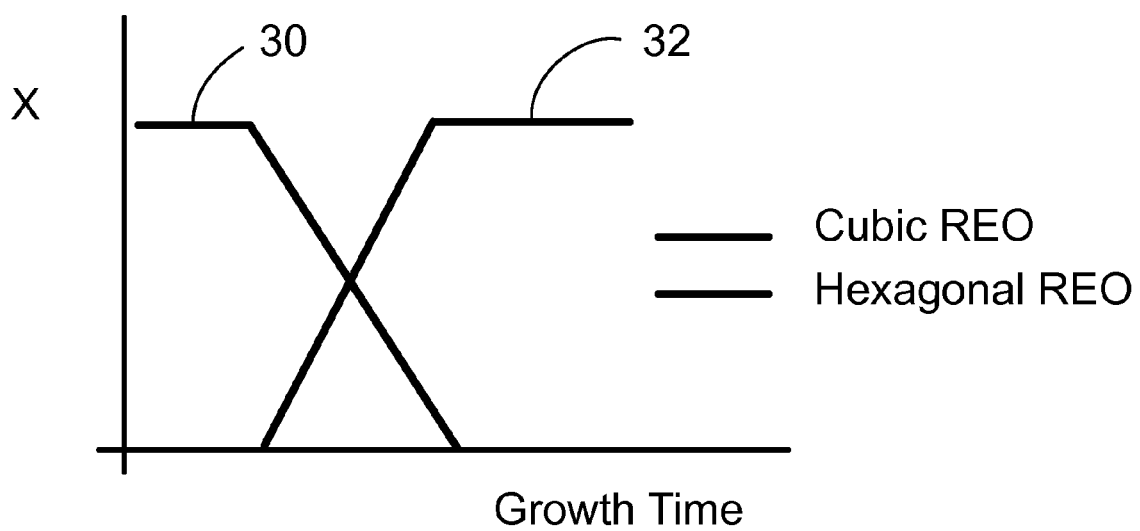
FIG. 4 is a simplified graphical representation of a process for depositing rare earth transition layers in accordance with the present invention.

It will be noted that layers 22 and 24 are adjacent and generally layer 24 is epitaxially grown on layer 22. To allow the single crystal growth (e.g. layer 24 on layer 22) to be performed without undue crystal strain and defects, the first material (in this example $Eu_2O_3$) is grown generally as indicated by line 30 in FIG. 4. That is, the $Eu_2O_3$ is started at maximum growth and gradually reduced to zero. At approximately a mid point in the reduction of the growth of $Eu_2O_3$, the growth of $Sc_2O_3$ is started from zero and gradually increased to a maximum level as shown by line 32. Generally layers 22 and 24 are approximately a thousand angstroms thick with the gradation or gradual change starting at approximately the mid point of each layer. By gradually changing from the cubic crystal structure material to the hexagonal crystal structure material, crystal defects are avoided and both layers 22 and 24 are single crystal material at the junctions with layers 26 and 28, respectively.

The process described above allows higher bandgap materials, such as InGaN, to be grown or incorporated onto single crystal silicon in a solar cell such as illustrated in FIG. 3. Thus, the lower energy of solar emissions directed onto solar cell 20 is absorbed by the silicon and the higher energy of solar emissions directed onto solar cell 20 is absorbed by the InGaN. Since all of the materials of solar cell 20 are single crystal materials, the entire cell can be grown, for example epitaxially, in a single process (i.e. in situ).

Figure 5:
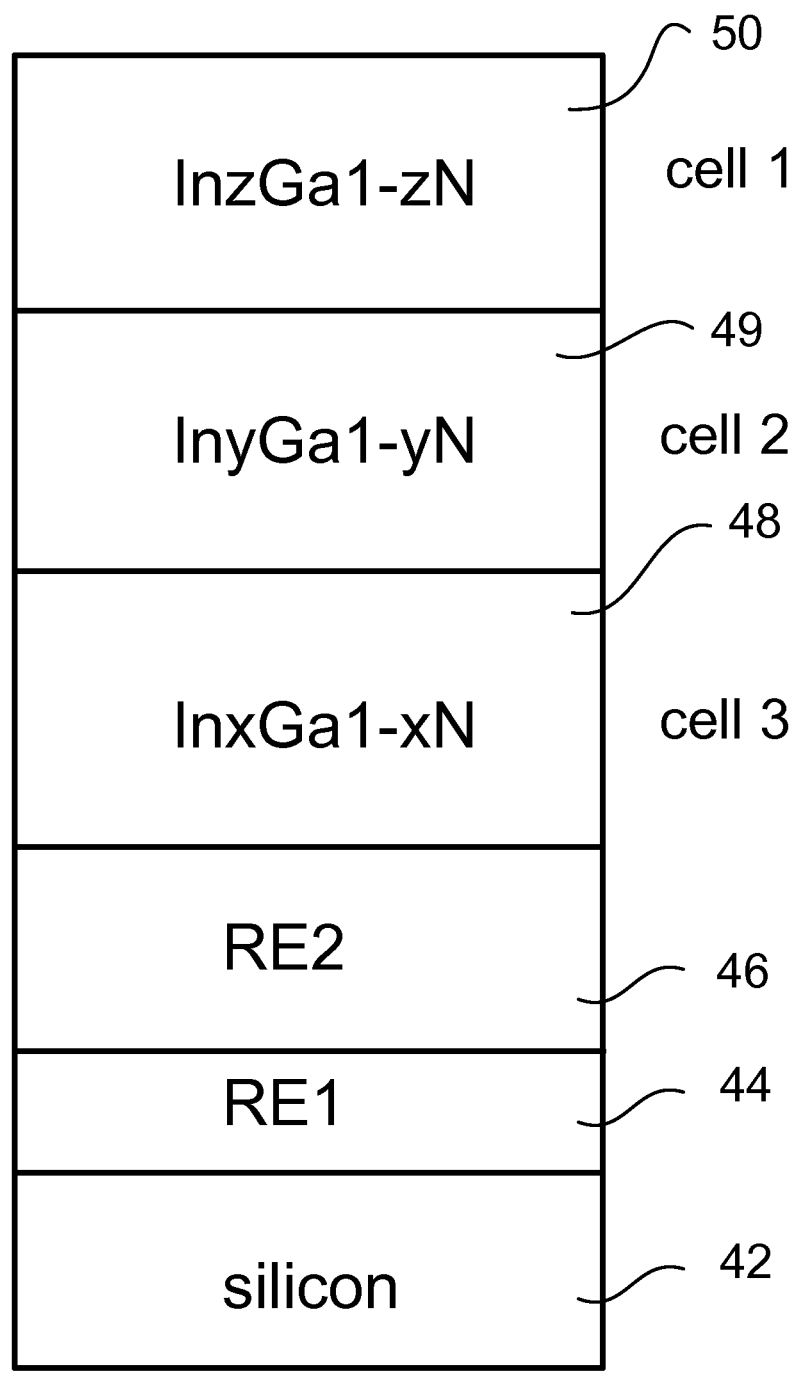
FIG. 5 is a simplified cross-sectional view of one embodiment of a solar cell in accordance with the present invention.

Turning to FIG. 5, a solar cell 40 is illustrated that has multiple layers of higher bandgap materials designed to collect additional portions of the solar spectrum. In this specific example, a silicon solar cell or layer 42 of silicon forms the base for the structure. A first oxide layer 44 of rare earth or the like with a cubic crystal structure is grown or deposited on silicon layer 42 and a second layer 46 of rare earth or the like with a hexagonal crystal structure is grown or deposited on layer 42 in a graduated process as described above. A first single crystal layer 48 of higher bandgap material, e.g. $In_xGa_{1-x}N$, is deposited on layer 46 in an approximately lattice matched configuration. A second single crystal layer 49 of higher bandgap material, e.g. $In_yGa_{1-y}N$ is deposited on layer 46 in an approximately lattice matched configuration. A third single crystal layer 50 of higher bandgap material, e.g. $In_zGa_{1-z}N$ is deposited on layer 46 in an approximately lattice matched configuration. In this example, x, y, and z are different numbers that change the ratio of indium and gallium material to a different bandgap and, thus, absorb different portions of energy in the solar spectrum. It will be understood that three layers of material are illustrated and explained for purposes of example and any desired number of layers and higher bandgap material that fulfill the collection function may be used.

Figure 6:
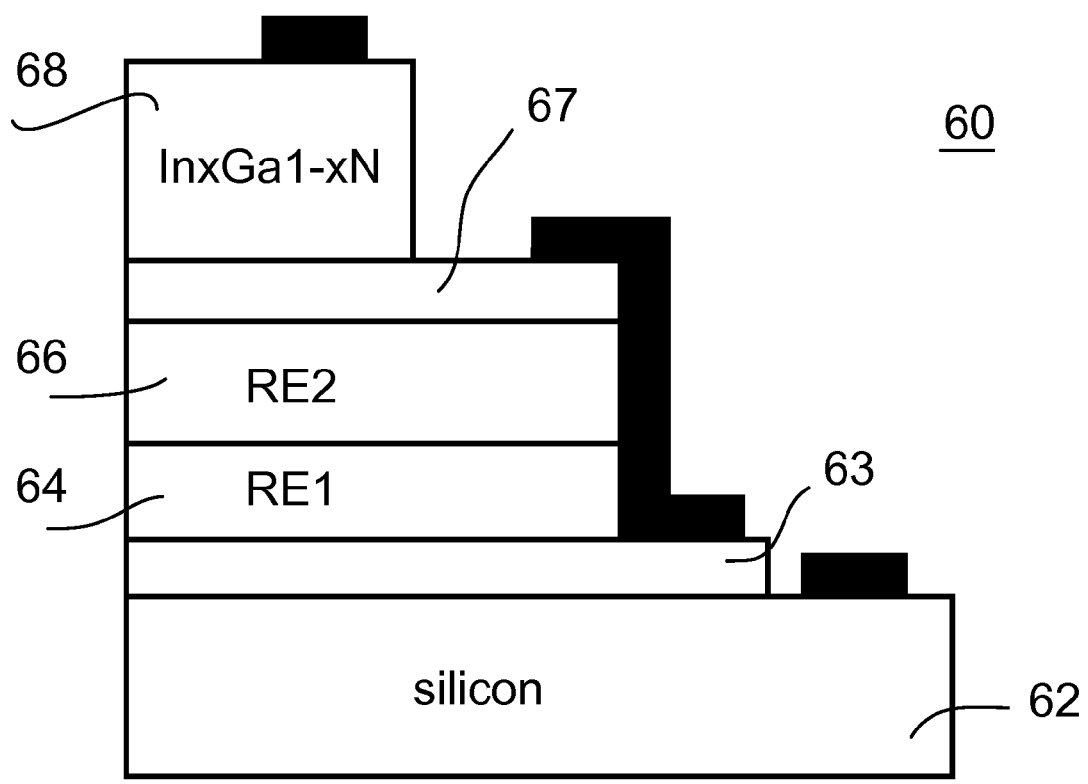
FIG. 6 is a simplified cross-sectional view illustrating one embodiment of electrical connections for a solar cell in accordance with the present invention.

Turning now to FIG. 6, an example of one specific contact arrangement of a solar cell in accordance with the present invention is illustrated. Basically, a solar cell 60 is grown similar to Solar cell 20 of FIG. 2. That is, a layer 62 of single crystal silicon (e.g. a substrate, wafer, or chip) is provided. Two single crystal transition layers 64 and 66 of rare earth or the like are deposited on the surface of silicon layer 62 in a gradation and substantially lattice matched arrangement. A layer 68 of single crystal higher bandgap material, e.g. $In_xGa_{1-x}N$, is deposited on the upper surface of layer 66 in a substantially lattice matched arrangement.

In this example of a specific contact arrangement, a contact layer 63 is formed between layers 62 and 64. Contact layer 63 can be formed, for example, by heavily doping a thin layer of silicon from layer 62. The doping can be accomplished in a variety of methods including during the deposition of single crystal layer 62, by depositing a thin doped single crystal layer on silicon layer 62, prior to depositing layers 64 and 66, or by doping after the deposition is completed. In a similar fashion a contact layer 67 is formed between layers 66 and 68. Metal contacts are then formed on the upper surface of layer 68 and on the exposed surface of layer 62. Also a metal contact is formed between contact layers 63 and 67 to act as a common or a series connection for each of the solar cell components. If solar cell 60 is exposed to solar radiation from the bottom, the various contacts will not reduce the light impinging on it. If solar cell 60 is exposed to solar radiation from the top, the various contacts may be some transparent conductive material, typically made of indium-tin-oxide, aluminum-zinc-oxide or a very thin metal.

Thus, a new and improved high efficiency solar cell is disclosed that includes one or more single crystal layers of higher bandgap material in addition to a layer of single crystal silicon. The adjacent layers of higher bandgap material and silicon are lattice matched by intermediate transition layers of single crystal rare earth oxides or the like (e.g. materials classified in the IIIB group of the periodic table). The intermediate transition layers allow both the silicon and the higher bandgap material to be substantially lattice matched to the adjacent layer. Basically, the cubic crystal structure of silicon is converted to a hexagonal crystal structure by gradation layers of rare earth or the like. This lattice matching allows the entire structure to be grown in situ (i.e. one continuous process) and greatly reduces defects in the crystal structures.

Various changes and modifications to the embodiments herein chosen for purposes of illustration will readily occur to those skilled in the art. To the extent that such modifications and variations do not depart from the spirit of the invention, they are intended to be included within the scope thereof, which is assessed only by a fair interpretation of the following claims.

Having fully described the invention in such clear and concise terms as to enable those skilled in the art to understand and practice the same, the invention claimed is:

1. A solar cell comprising:
    a single crystal base including silicon with a cubic crystal structure and a bandgap;
    a single crystal layer of a second material with a higher bandgap than the bandgap of silicon;
    first and second single crystal transition layers of rare earth oxide positioned in overlying relationship with the first and second single crystal rare earth oxide transition layers graduated from a cubic crystal structure at one surface to a hexagonal crystal structure at an opposed surface and the first and second single crystal rare earth oxide transition layers positioned between the single crystal base and the single crystal layer of the second material with the one surface lattice matched to the single crystal base and the opposed surface lattice matched to the single crystal layer of the second material;
    a first electrical contact positioned on the single crystal base and a second electrical contact positioned on the single crystal layer of the second material;
    a first contact layer positioned between the single crystal base and one surface of the first and second single crystal transition layers and a second contact layer positioned between the single crystal layer of the second material and the opposed surface of the first and second single crystal transition layers;
    a third electrical contact extending across the first and second single crystal transition layers from the first contact layer to the second contact layer.

2. The solar cell as claimed in claim 1, wherein the single crystal layer of the second material includes $In_xGa1_{1-x}N$, where x is any number smaller than 1.

3. The solar cell as claimed in claim 1, comprising additional layers of single crystal material each with a higher bandgap than the bandgap of silicon and each additional layer has a bandgap different than other layers of the additional layers and a first layer of the additional layers is lattice matched to the single crystal layer of the second material, with each layer of the additional layers lattice matched to an adjacent additional layer.

4. The solar cell as claimed in claim 1, wherein the first single crystal transition layer of rare earth oxide includes $Eu_2O_3$.

5. The solar cell as claimed in claim 1, wherein the second crystal transition layer of rare earth oxide includes $Sc_2O_3$.

* * * * *